(12) United States Patent
Lo et al.

(10) Patent No.: US 11,322,474 B2
(45) Date of Patent: May 3, 2022

(54) SEMICONDUCTOR PACKAGE

(71) Applicant: Realtek Semiconductor Corp., HsinChu (TW)

(72) Inventors: Chin-Yuan Lo, HsinChu (TW); Chih-Hao Chang, HsinChu (TW); Tze-Min Shen, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/192,909

(22) Filed: Mar. 5, 2021

(65) Prior Publication Data
US 2021/0327844 A1 Oct. 21, 2021

(30) Foreign Application Priority Data
Apr. 20, 2020 (TW) .................................. 109113152

(51) Int. Cl.
*H01L 25/065* (2006.01)
*H01L 23/00* (2006.01)
*H01L 23/31* (2006.01)

(52) U.S. Cl.
CPC .......... *H01L 24/48* (2013.01); *H01L 23/3128* (2013.01); *H01L 24/06* (2013.01); *H01L 25/0655* (2013.01); *H01L 2224/04042* (2013.01); *H01L 2224/06515* (2013.01); *H01L 2224/48138* (2013.01); *H01L 2224/48228* (2013.01)

(58) Field of Classification Search
CPC ..... H01L 24/48; H01L 23/3128; H01L 24/06; H01L 25/0655; H01L 2224/04042; H01L 2224/06515; H01L 2224/48138; H01L 2224/48228; H01L 23/49816; H01L 23/50; H01L 23/5386; H01L 25/18
See application file for complete search history.

(56) References Cited

U.S. PATENT DOCUMENTS

2015/0113356 A1* 4/2015 Ken ..................... G11C 29/023
                                                                    711/132

* cited by examiner

*Primary Examiner* — Elias Ullah
(74) *Attorney, Agent, or Firm* — Winston Hsu (57) ABSTRACT

A semiconductor package includes a first chip and a second chip arranged side by side on a carrier substrate. The first chip is provided with a high-speed signal pads along a first side in proximity to the second chip. The second chip includes a redistribution layer, and the redistribution layer is provided with data (DQ) pads along the second side in proximity to the first chip. A plurality of first bonding wires is provided to directly connect the high-speed signal pads to the DQ pads. The redistribution layer of the second chip is provided with first command/address (CA) pads along the third side opposite to the second side, and a plurality of dummy pads corresponding to the first CA pads. The plurality of dummy pads are connected to second CA pads disposed along a fourth side of the second chip via interconnects of the redistribution layer.

14 Claims, 6 Drawing Sheets

SEMICONDUCTOR PACKAGE

BACKGROUND OF THE INVENTION

1. Field of the Invention

The present invention relates to the field of semiconductor packaging. More specifically, the present invention relates to a system-in-package (SiP).

2. Description of the Prior Art

As portable electronic devices become smaller, the size of semiconductor packages in electronic devices must also be reduced. To achieve this, system-in-package (SiP) technology is widely used because it can increase the capacity of semiconductor packages.

Taking the TV chip as an example, there are usually at least a system on chip (SoC) and a memory chip in a system-in-package, for example, a low-voltage double data rate (LPDDR) dynamic random access memory (DRAM) chip or a known good-die (kgd). Because the pad arrangement on the DRAM chip is a fixed specification, it is usually necessary to form an additional redistribution layer (RDL) to meet the performance requirements of different TV chips.

However, different rewiring layer designs are required on DRAM chips for different TV chips, which would increase costs and make management complicated.

SUMMARY OF THE INVENTION

One object of the present invention is to provide an improved semiconductor package, which can improve the aforementioned shortcomings and shortcomings of the prior art.

One aspect of the present invention provides a semiconductor package including a carrier substrate comprising a first surface and a second surface opposite to the first surface, and a first chip and a second chip mounted side by side on the first surface of the carrier substrate. The first chip is provided with a plurality of high-speed signal pads along a first side in proximity to the second chip. The second chip includes a redistribution layer. The redistribution layer is provided with a plurality of data (DQ) pads along a second side in proximity to the first chip. A plurality of first command/address (CA) pads and a plurality of dummy pads corresponding to the plurality of first CA pads are disposed on a third side opposite to the second side. The plurality of dummy pads is connected to a plurality of second CA pads disposed along a fourth side adjacent to the third side through interconnects of the redistribution layer. A plurality of first bonding wires is disposed to directly connect the plurality of high-speed signal pads to the plurality of data (DQ) pads.

According to some embodiments, the semiconductor package further comprises a plurality of second bonding wires, directly and electrically connecting the plurality of first CA pads to the plurality of dummy pads.

According to some embodiments, the semiconductor package further comprises a plurality of third bonding wires, directly and electrically connecting the plurality of second CA pads to corresponding gold fingers on the first surface of the carrier substrate.

According to some embodiments, the second chip is provided with a plurality of power or ground (P/G) pads along the fourth side.

According to some embodiments, the semiconductor package further comprises a plurality of fourth bonding wires, directly and electrically connected to the plurality of P/G pads to the corresponding golden fingers on the first surface of the carrier substrate.

According to some embodiments, part of the plurality of fourth bonding wires and part of the plurality of third bonding wires constitute a GSG or GSSG wire configuration.

According to some embodiments, a distance between each of the plurality of first CA pads and each of the plurality of dummy pads is less than 200 micrometers.

According to some embodiments, a distance between each of the plurality of first CA pads and each of the plurality of dummy pads is between 100-200 micrometers.

According to some embodiments, the first chip and the second chip are mounted on the first surface of the carrier substrate with an adhesive layer.

According to some embodiments, a plurality of solder balls is provided on the second surface of the carrier substrate, wherein the plurality of solder balls is ball grid array solder balls.

According to some embodiments, the first chip comprises a system on chip, and the second chip comprises a memory chip.

According to some embodiments, a plurality of passive elements is further provided on the first surface of the carrier substrate.

According to some embodiments, the plurality of DQ pads is arranged on the redistribution layer.

According to some embodiments, the semiconductor package further comprises an encapsulant covering the first chip and the second chip.

These and other objectives of the present invention will no doubt become obvious to those of ordinary skill in the art after reading the following detailed description of the preferred embodiment that is illustrated in the various figures and drawings.

DETAILED DESCRIPTION

In the following, the details will be explained with reference to the drawings, and the contents in these drawings also form part of the detailed description of the specification, and are illustrated in a specific example description manner in which this embodiment can be implemented. The following examples have described enough details to enable those of ordinary skill in the art to implement them. Of course, other embodiments may be adopted, or any structural, logical, and electrical changes may be made without departing from the embodiments described in the text. Therefore, the detailed description below should not be considered as a limitation, on the contrary, the embodiments contained therein will be defined by the scope of the attached patent application.

It should be understood that although the terms "first", "second", etc. may be used herein to describe various elements, regions, layers and/or sections, these elements, regions, layers and/or sections should not be limited by these terms. These terms are only used to distinguish one element, region, layer or section from another element, region, layer or section. Accordingly, the first element, region, layer or section discussed below may be referred to as the second element, region, layer or section without departing from the teachings of the exemplary embodiments.

Hereinafter, the term "system-in-package" or "SiP" refers to a plurality of integrated circuit (IC) chips or dies with different functions that are encapsulated in a single package. The term "wire bonding system-in-package" or "WBSiP" refers to packaging a plurality of chips together, and at least one of the chips is interconnected by wire bonding. The term "system on chip" or "SoC" refers to an integrated circuit that integrates various components of a computer or other electronic system into a single chip. The term "kgd" refers to a known good die.

Figure 1:
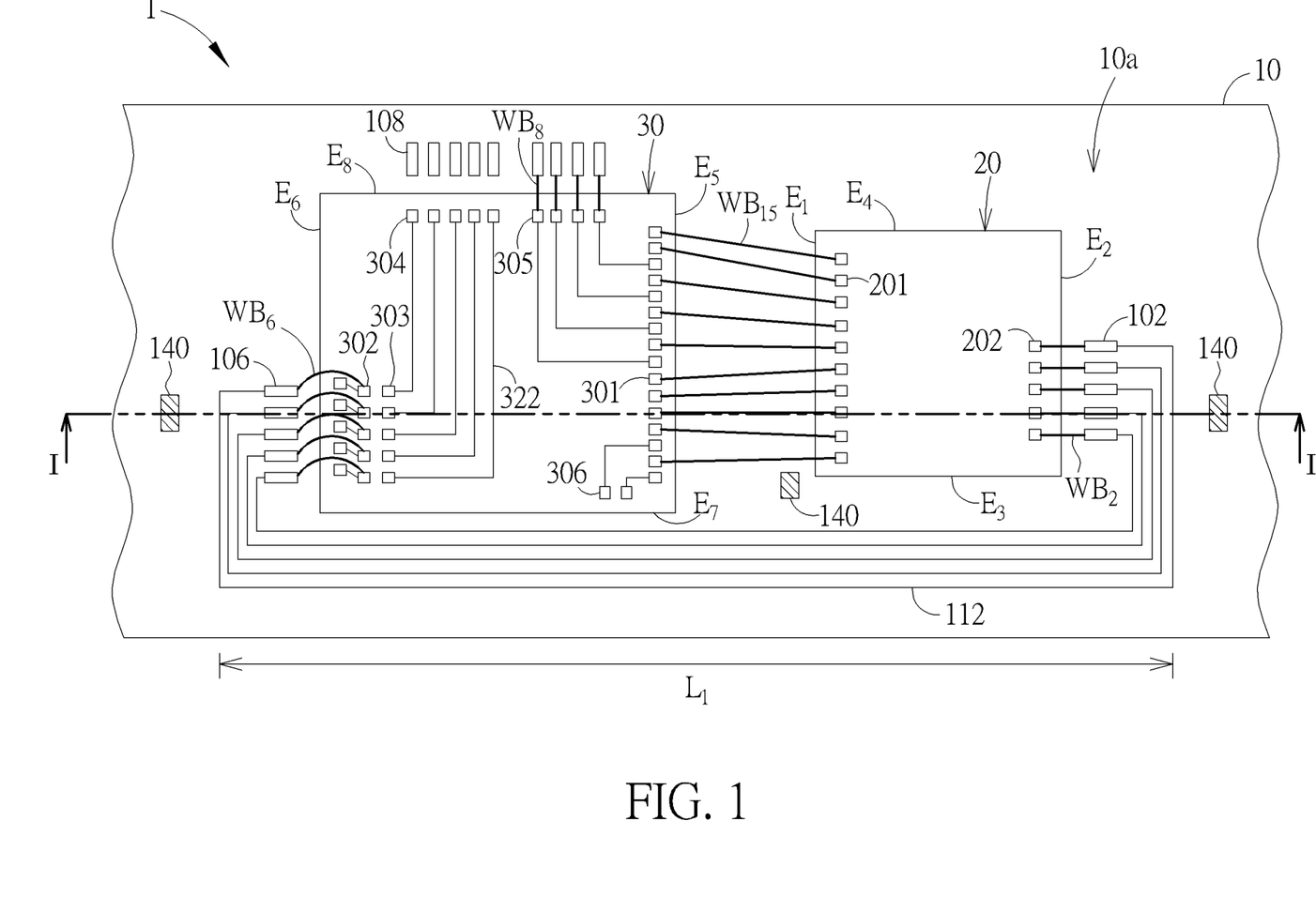
FIG. 1 is a schematic top view of a semiconductor package according to an embodiment of the present invention.
Figure 2:
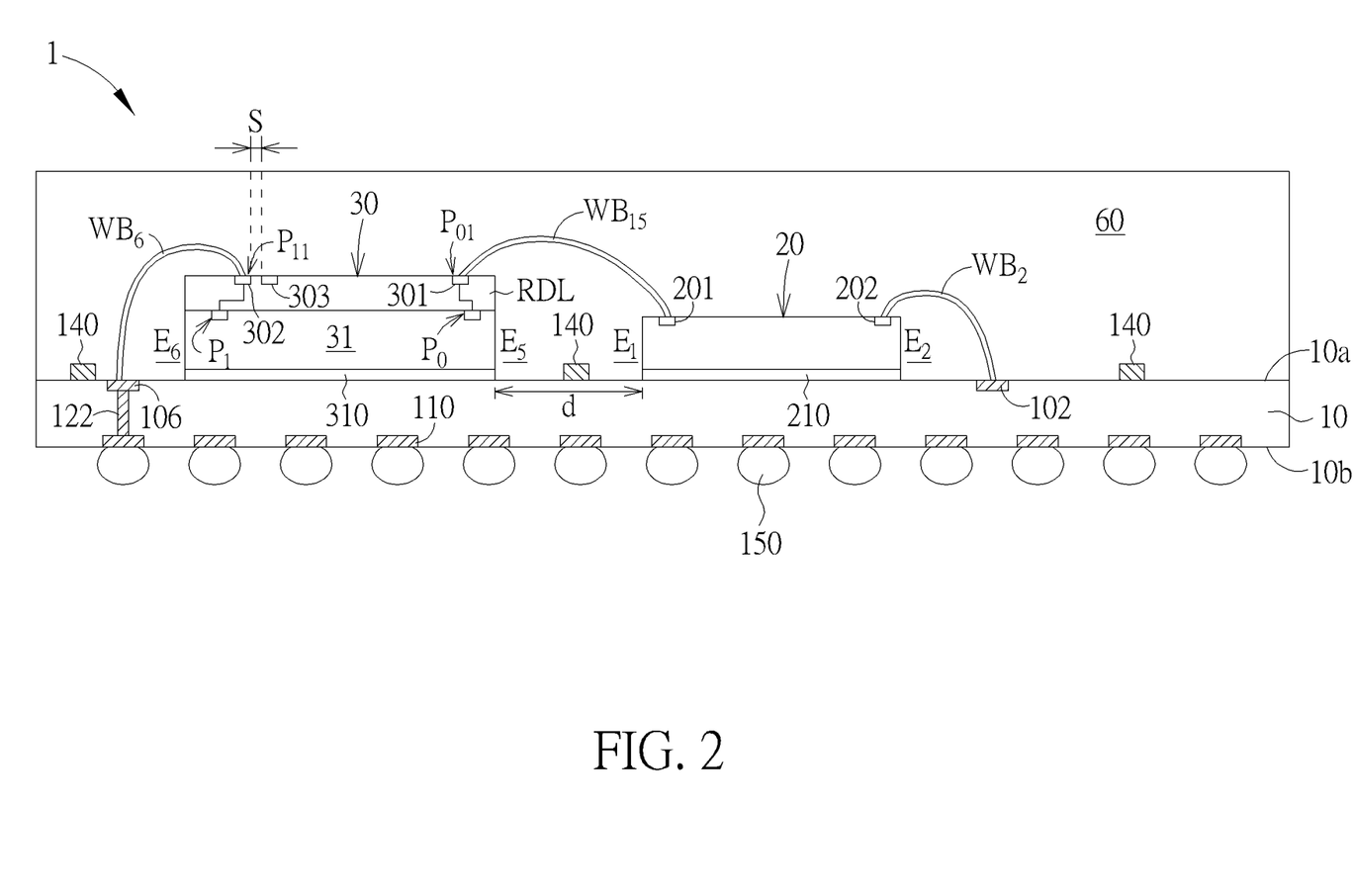
FIG. 2 is a schematic cross-sectional view taken along line I-I' in FIG. 1.

Please refer to FIG. 1 and FIG. 2, wherein FIG. 1 is a schematic top view of a semiconductor package according to an embodiment of the present invention, and FIG. 2 is a schematic cross-sectional view taken along line I-I' in FIG. 1. As shown in FIGS. 1 and 2, the semiconductor package 1 includes a carrier substrate 10 having a first surface 10a and a second surface 10b opposite to the first surface 10a. According to an embodiment of the present invention, the semiconductor package 1 may be a system-in-package or a wire-bonding system-in-package. According to the embodiment of the present invention, at least a first chip 20 and a second chip 30 are disposed on the first surface 10a of the carrier substrate 10. For example, the first chip 20 and the second chip 30 may be secured on the first surface 10a of the carrier substrate 10 with adhesive layers 210 and 310, respectively.

Multiple solder balls 150, for example, ball grid array (BGA) solder balls, are provided on the second surface 10b of the carrier substrate 10. The solder balls 150 can be reflowed subsequently to attach the semiconductor package 1 to a printed circuit board (PCB) or motherboard (not shown). According to an embodiment of the invention, the carrier substrate 10 may be a multilayer circuit board or a packaging substrate. For example, the carrier substrate 10 may be a two-layer, three-layer, or four-layer circuit board, but is not limited thereto.

For example, the carrier substrate 10 may be an organic packaging substrate, including metal wires and resin, such as BT (bismalemide triazene) epoxy resin. Those skilled in the art should understand that other materials may be used to form the carrier substrate 10, for example, ceramic or plastic. For the sake of simplicity, the internal routing of the carrier substrate 10 in FIG. 2 only schematically shows a part of the gold fingers 102, 106 and a part of the via hole 122 which is connected to the solder ball pad 110. The internal routing may electrically couple the signal of the semiconductor die to the solder ball 150 on the second surface 10b.

According to an embodiment of the present invention, for example, the first chip 20 may be a system on chip (SoC), and the second chip 30 may be a memory chip, such as a dynamic random access memory (DRAM) package, having more than one DRAM chip DRAM (or DRAM kdg) 31, for example, double data rate 3 (DDR3) dies or double data rate 4 (DDR4) dies, etc. For example, the second chip 30 may include a plurality of stacked DRAM dies 31, wherein an insulating film (not shown) formed by film over wire (FOW) technology may be provided between the stacked DRAM dies. Of course, in other embodiments, the DRAM dies may also be stacked in a stepped manner. To simplify the description, only one DRAM die 31 in the second chip 30 is illustrated in the figure.

According to an embodiment of the present invention, the first chip 20 and the second chip 30 are mounted on the first surface 10a of the carrier substrate 10 in a side-by-side manner. According to an embodiment of the present invention, for example, the distance d between the first chip 20 and the second chip 30 may be between about 0.5 mm and 4.0 mm. In other embodiments, the distance d between the first chip 20 and the second chip 30 may exceed 4.0 mm.

According to an embodiment of the present invention, on the first surface 10a of the carrier substrate 10, a plurality of passive elements 140 such as a capacitor, an inductor, or a resistor may be additionally provided. According to an embodiment of the present invention, for example, the passive element 140 may be a decoupling capacitor of size 01005 (0.4 mm×0.2 mm), but is not limited thereto. In addition, the first chip 20 and the second chip 30 may be covered with an encapsulant 60 to isolate the first chip 20 and the second chip 30 from the outside.

According to an embodiment of the present invention, for example, the first chip 20 includes four sides $E_1$~$E_4$, and the first chip 20 is provided with a plurality of high-speed signal pads 201 on the side $E_1$. For example, the high-speed signal pad 201 may be a data (DQ) pad for transmitting high-speed data signals between the first chip 20 and the second chip 30, for example, 2133 MT/s, 2400 MT/s, 2666 MT/s or higher data transmission rate, but not limited to this.

According to an embodiment of the present invention, for example, the second chip 30 includes four sides $E_1$~$E_4$. According to an embodiment of the present invention, a redistribution layer RDL may be provided on the DRAM die 31. The structure and material of the redistribution layer RDL are well known in the art, for example, including at least one insulating layer and at least one wire layer, the details of which are omitted here. The redistribution layer RDL fan-outs the pad positions $P_0$ on the active surface of the DRAM die 31 to the pad positions $P_{01}$ on the redistribution layer RDL, and the pads 301 are formed at the pad positions $P_{01}$. According to an embodiment of the present invention, on the redistribution layer RDL, the pads 301 arranged along the side $E_5$ are mainly data (DQ) pads corresponding to the high-speed signal pads 201.

According to an embodiment of the present invention, for example, the redistribution layer RDL fan-outs the pad positions $P_1$ on the active surface of the DRAM die 31 to the pad positions $P_{11}$ on the redistribution layer RDL, and the pads 302 is formed at the pad positions $P_{11}$. According to an embodiment of the invention, the side $E_5$ and the side $E_6$ are opposite sides. According to an embodiment of the present invention, for example, on the redistribution layer RDL, the pads 302 formed along the side $E_6$ may be CA pads (pads for transmitting command/address (CA) signals). In addition, on the redistribution layer RDL, power or ground (Power/Ground, P/G) pads 305 and 306 may be formed along the sides $E_7$ and $E_8$, respectively.

According to an embodiment of the present invention, for example, on the redistribution layer RDL, a plurality of dummy pads 303 are further provided corresponding to the CA pads 302. The CA pad 302 and the dummy pad 303 are arranged in a one-by-one fashion. The distance S between the CA pad 302 and the dummy pad 303 is less than 200 micrometers, for example, between 100 and 200 micrometers, but not limited thereto. As shown in FIG. 1, the dummy pads 303 are respectively connected to the plurality of CA pads 304 disposed along the side $E_8$ through the interconnects (or traces) 322 of the redistribution layer RDL.

According to an embodiment of the present invention, for example, gold fingers 102 are provided on the first surface 10a of the carrier substrate 10 along the side $E_2$ of the first chip 20, and gold fingers 106, 108 are provided on the first surface 10a of the carrier substrate 10 along the sides $E_6$, $E_8$ of the second chip 30, respectively. The input/output (I/O) pads 202 provided along the side $E_2$ on the first chip 20 are electrically connected to the golden fingers 102 through the bonding wires $WB_2$. According to an embodiment of the present invention, the bonding wires $WB_2$ may be gold wires or copper wires, but not limited thereto.

According to an embodiment of the present invention, the plurality of high-speed signal pads 201 provided along the side $E_1$ of the first chip 20 are directly connected to the DQ pads 301 provided along the side $E_5$ on the redistribution layer RDL of the second chip 30 through the bonding wires $WB_{15}$. The high-speed signal pad 201 of the first chip 20 and the DQ pads 301 on the redistribution layer RDL of the second chip 30 are directly connected by the bonding wires $WB_{15}$ without passing through the carrier substrate 10, so the signal distortion problem can be improved.

According to an embodiment of the present invention, the CA pads 302 provided along the side $E_6$ on the second chip 20 are electrically connected to the corresponding gold fingers 106 through the bonding wires $WB_6$, and then the gold finger 106 are connected to the golden fingers 102 through the traces 112 of the carrier substrate 10. The signal transmission distance is approximately $L_1$. According to an embodiment of the present invention, for example, the P/G pads 305 disposed along the side $E_8$ on the second chip 20 can be electrically connected to the corresponding golden fingers 108 through the bonding wires WBs.

In this embodiment, the dummy pads 303 are not electrically connected with the CA pads 302, and the plurality of CA pads 304 disposed along the side $E_8$ of the second chip 20 are not electrically connected to the first surface 10a of the carrier substrate 10, so during operation, the plurality of CA pads 304 disposed along the side $E_8$ of the second chip 20 are electrically floating.

Figure 3:
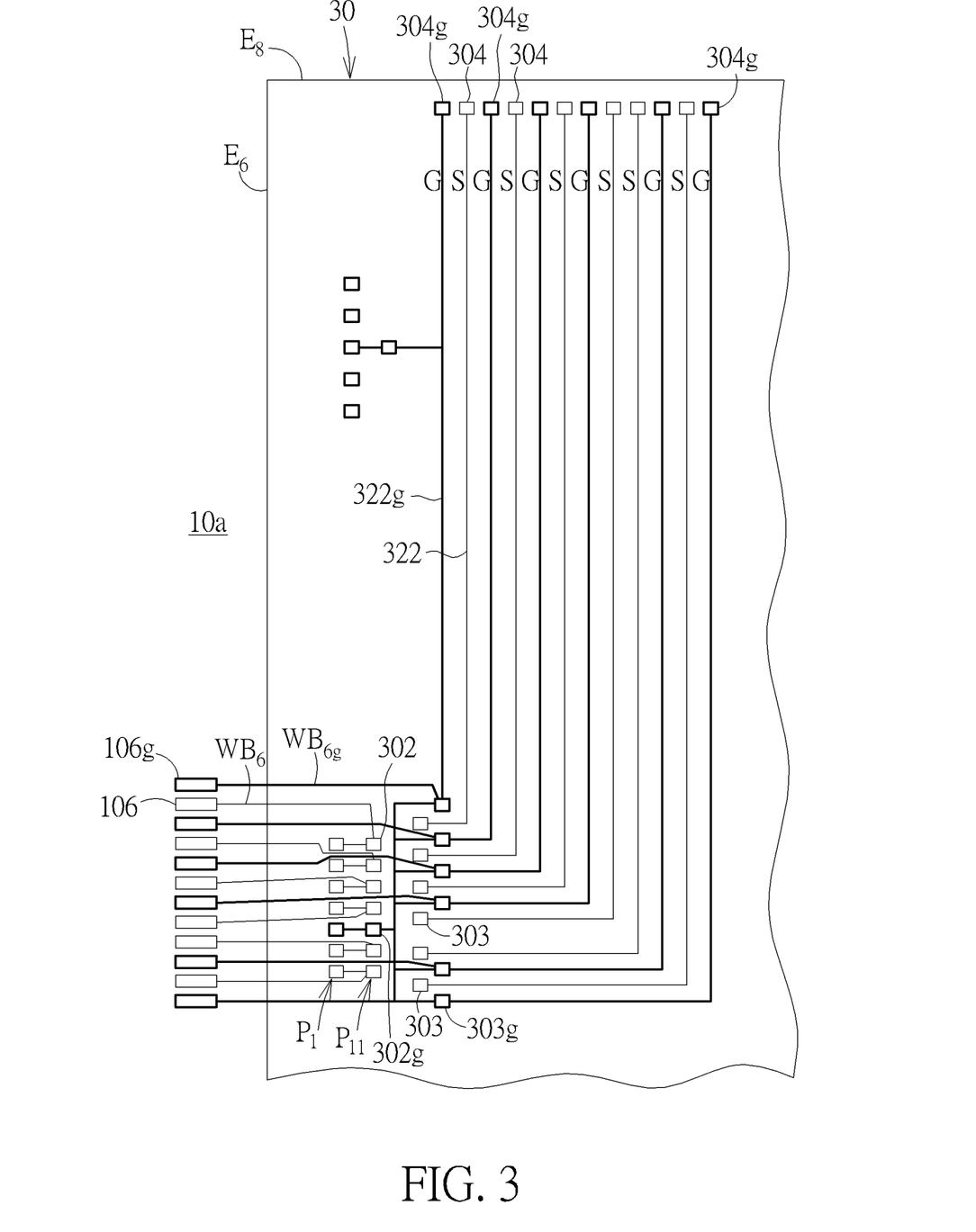
FIG. 3 is a schematic top perspective view showing a germane portion of the redistribution layer RDL of the second chip in FIG. 1.

FIG. 3 is a schematic top perspective view showing a germane portion of the redistribution layer RDL of the second chip 30 in FIG. 1, wherein like elements, regions, materials, or layers are designated by like numeral numbers or labels. As shown in FIG. 3, the CA pads 302 disposed along the side $E_6$ on the second chip 30 are electrically connected to the corresponding golden fingers 106 through the bonding wires $WB_6$. The redistribution layer RDL further includes at least one ground pad 302g, located between the CA pads 302, and juxtaposed with the CA pads 302 in the same row. The ground pads 302g are connected to the plurality of ground pads 304g disposed along the side $E_8$ through the interconnects (or traces) 322g of the redistribution layer RDL, respectively, so that the interconnects 322 for transmitting command/address (CA) signals are surrounded by grounded interconnects 322g, thereby forming a GSG or GSSG configuration (G stands for ground, S stands for CA signal), which can improve signal integrity. In addition, a ground pad 303g is provided on each interconnect 322g, and the ground pad 303g is bonded to the corresponding golden finger 106g with a bonding wire $WB_{6g}$, so that the bonding wire $WB_6$ transmitting the CA signal is surrounded by the grounded bonding wire $WB_{6g}$, thereby forming the aforesaid GSG or GSSG wire configuration.

Figure 4:
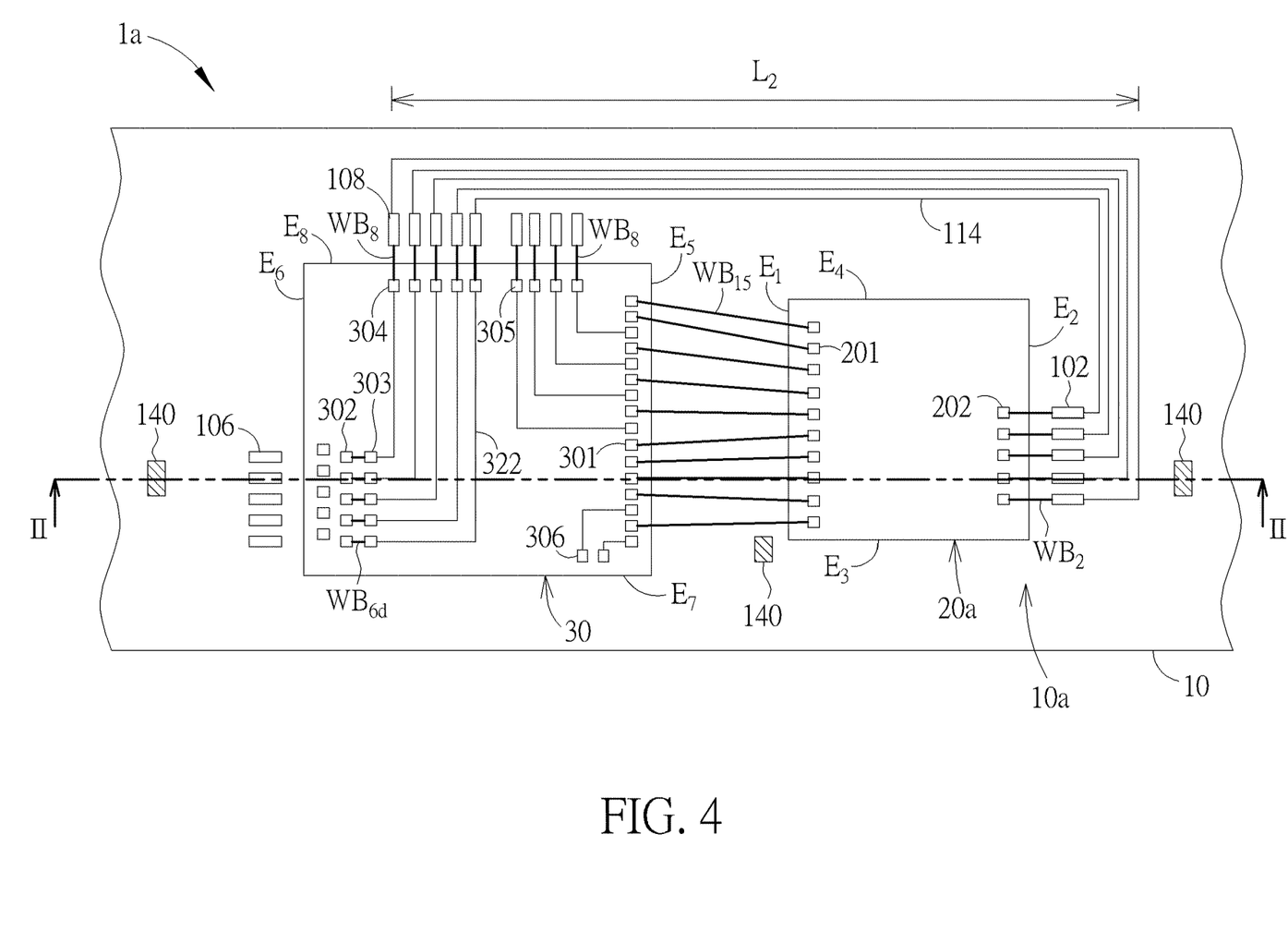
FIG. 4 is a schematic top view of a semiconductor package according to another embodiment of the invention.
Figure 5:
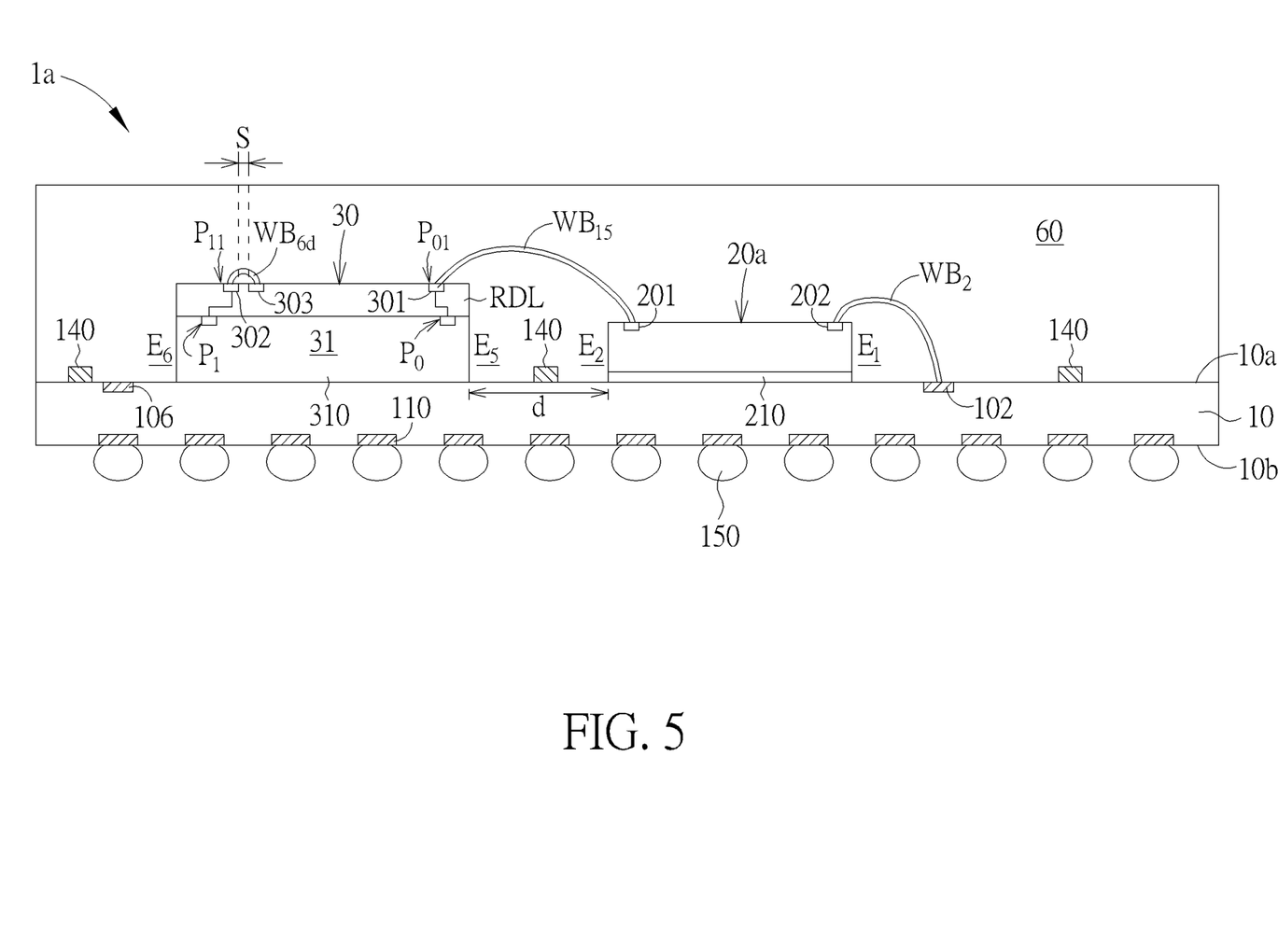
FIG. 5 is a cross-sectional view taken along line II-II' in FIG. 4.

Please refer to FIG. 4 and FIG. 5, wherein FIG. 4 is a schematic top view of a semiconductor package according to another embodiment of the invention, and FIG. 5 is a cross-sectional view taken along line II-II' in FIG. 4, wherein like elements, regions, layers, or materials are designated by like numeral numbers or labels. As shown in FIGS. 4 and 5, the difference from the previous embodiment (FIG. 1 and FIG. 2) is that the first chip 20a of the semiconductor package 1a may be a SoC chip with higher performance. In the previous embodiment (FIG. 1 and FIG. 2), the CA pads 302 on the second chip 30 are connected to the corresponding gold fingers 102 via the traces 112 of the carrier substrate 10, and the signal transmission distance is approximately $L_1$, so the path is too long and the signal impedance is too high, which is not desirable. In this embodiment, the CA pads 302 on the second chip 30 can be electrically connected to the dummy pads 303 with the bonding wire $WB_{6d}$, and then the plurality of CA pads 304 disposed along the side $E_8$ of the second chip 30 can be electrically bonded to the corresponding golden fingers 108 through the bonding wires WBs. The golden fingers 108 are connected to the corresponding golden fingers 102 via the traces 114 of the carrier substrate 10. The signal transmission distance is about $L_2$ ($L_2 < L_1$). Such a path is shorter, and the signal impedance is lower. Therefore, it is suitable for chips with high performance requirements.

Figure 6:
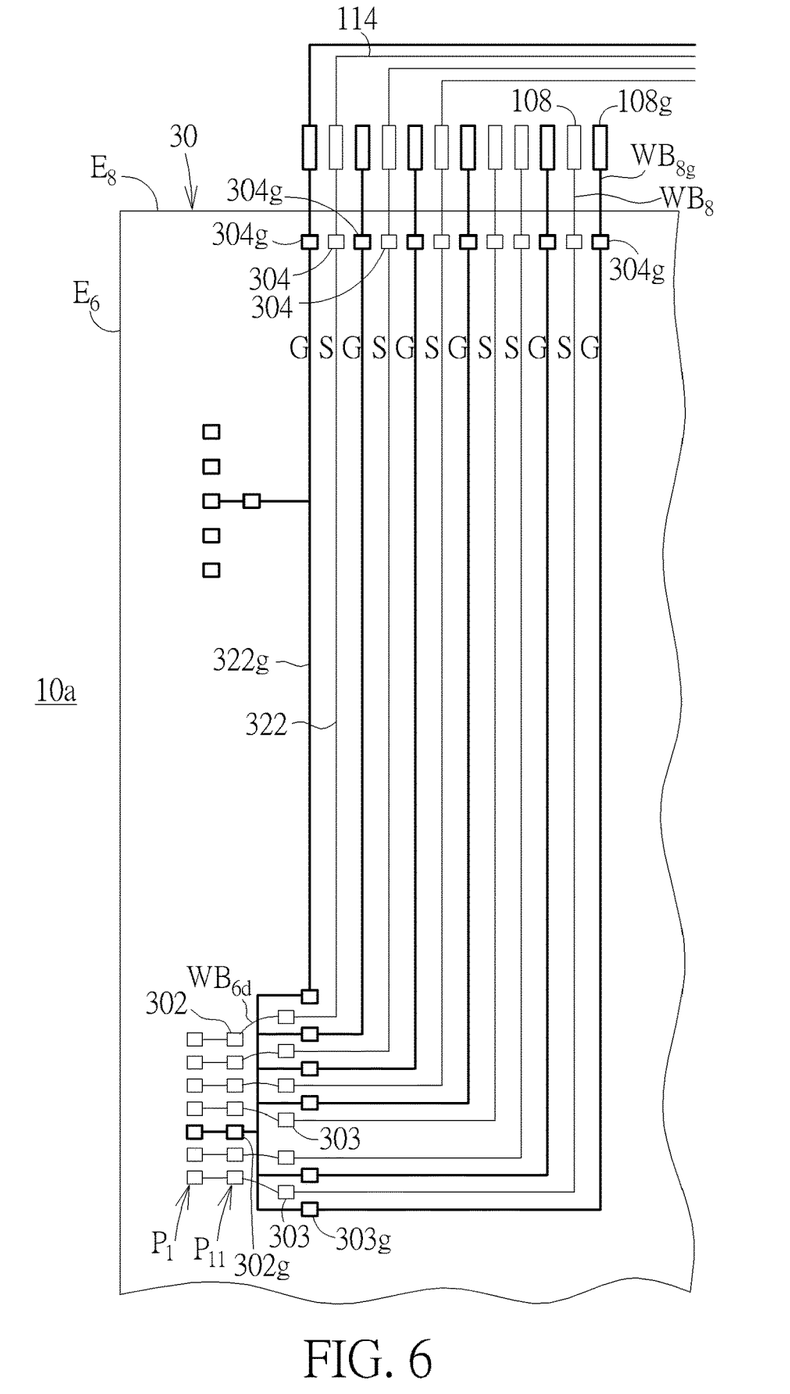
FIG. 6 is a schematic top perspective view showing a germane portion of the redistribution layer RDL of the second chip in FIG. 4.

FIG. 6 is a schematic top perspective view of the partial redistribution layer RDL of the second chip 30 in FIG. 4, wherein like elements, regions, materials, or layers are designated by the like numeral numbers or labels. As shown in FIG. 6, the CA pads 302 disposed along the side $E_6$ on the second chip 30 are electrically connected to the corresponding dummy pads 303 through the bonding wires $WB_{6d}$. Similarly, the redistribution layer RDL further includes at least one ground pad 302g, located between the CA pads 302 and juxtaposed with the CA pads 302 in the same row. The ground pad 302g is connected to the plurality of ground pads 304g disposed along the side $E_8$ through the interconnects 322g of the redistribution layer RDL, respectively, so that the interconnects 322 for transmitting CA signals are surrounded by the grounded interconnects 322g, thereby forming GSG or GSSG configuration (G stands for ground, S stands for CA signal), which can improve signal integrity. In addition, on the side $E_8$, the CA pads 304 and the ground pads 304g are respectively bonded to the corresponding golden fingers 108 and 108g through the bonding wires $WB_8$ and $WB_{8g}$, so that the bonding wire $WB_8$ transmitting the CA signal is surrounded by the grounded bonding wire $WB_{8g}$, constituting the aforesaid GSG or GSSG wire configuration.

As can be seen from the above disclosure, the present invention is characterized in that the dummy pads 303 corresponding to the CA pads 302 are disposed along the side $E_6$ of the second chip 20 on the redistribution layer RDL of the second chip 20, and through the interconnects 322, 322g, a plurality of CA pads 304 and ground pads 304g are arranged on the side $E_8$ of the second chip 20, so that it can be flexibly applied to the first chip 20 with different performance requirements, taking into account the commonality and flexibility of the redistribution layer RDL of the second chip 30, and makes management easier.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
a carrier substrate comprising a first surface and a second surface opposite to the first surface;
a first chip and a second chip mounted side by side on the first surface of the carrier substrate, wherein the first chip is provided with a plurality of high-speed signal pads along a first side in proximity to the second chip, wherein the second chip comprises a redistribution layer, and the redistribution layer is provided with a plurality of data (DQ) pads along a second side in proximity to the first chip, and a plurality of first command/address (CA) pads and a plurality of dummy pads corresponding to the plurality of first CA pads are disposed on a third side opposite to the second side, and wherein the plurality of dummy pads is connected to a plurality of second CA pads disposed along a fourth side adjacent to the third side through interconnects of the redistribution layer; and
a plurality of first bonding wires directly connecting the plurality of high-speed signal pads to the plurality of data (DQ) pads.

2. The semiconductor package according to claim 1, wherein the semiconductor package further comprises a plurality of second bonding wires, directly and electrically connecting the plurality of first CA pads to the plurality of dummy pads.

3. The semiconductor package according to claim 2, wherein the semiconductor package further comprises a plurality of third bonding wires, directly and electrically connecting the plurality of second CA pads to corresponding gold fingers on the first surface of the carrier substrate.

4. The semiconductor package according to claim 3, wherein the second chip is provided with a plurality of power or ground (P/G) pads along the fourth side.

5. The semiconductor package according to claim 4, wherein the semiconductor package further comprises a plurality of fourth bonding wires, directly and electrically connected to the plurality of P/G pads to the corresponding golden fingers on the first surface of the carrier substrate.

6. The semiconductor package according to claim 5, wherein part of the plurality of fourth bonding wires and part of the plurality of third bonding wires constitute a GSG or GSSG wire configuration.

7. The semiconductor package according to claim 1, wherein a distance between each of the plurality of first CA pads and each of the plurality of dummy pads is less than 200 micrometers.

8. The semiconductor package according to claim 1, wherein a distance between each of the plurality of first CA pads and each of the plurality of dummy pads is between 100-200 micrometers.

9. The semiconductor package according to claim 1, wherein the first chip and the second chip are mounted on the first surface of the carrier substrate with an adhesive layer.

10. The semiconductor package according to claim 1, wherein a plurality of solder balls is provided on the second surface of the carrier substrate, wherein the plurality of solder balls is ball grid array solder balls.

11. The semiconductor package according to claim 1, wherein the first chip comprises a system on chip, and the second chip comprises a memory chip.

12. The semiconductor package according to claim 1, wherein a plurality of passive elements is further provided on the first surface of the carrier substrate.

13. The semiconductor package according to claim 1, wherein the plurality of DQ pads is arranged on the redistribution layer.

14. The semiconductor package according to claim 1, wherein the semiconductor package further comprises an encapsulant covering the first chip and the second chip.

* * * * *